(12) United States Patent
Park et al.

(10) Patent No.: US 9,202,716 B2
(45) Date of Patent: Dec. 1, 2015

(54) METHODS OF FABRICATING FAN-OUT WAFER LEVEL PACKAGES AND PACKAGES FORMED BY THE METHODS

(71) Applicant: Samsung Electronics Co., Ltd., Suwon-Si, Gyeonggi-Do (KR)

(72) Inventors: Jin-Woo Park, Seoul (KR); Hogeon Song, Suwon-si (KR); Seokhyun Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 289 days.

(21) Appl. No.: 13/626,012

(22) Filed: Sep. 25, 2012

(65) Prior Publication Data

US 2013/0147063 A1   Jun. 13, 2013

(30) Foreign Application Priority Data

Dec. 9, 2011   (KR) .......................... 10-2011-0131696

(51) Int. Cl.
*H01L 23/34*   (2006.01)
*H01L 21/56*   (2006.01)
(Continued)

(52) U.S. Cl.
CPC .......... *H01L 21/568* (2013.01); *H01L 23/5389* (2013.01); *H01L 24/24* (2013.01); *H01L 24/73* (2013.01); *H01L 24/82* (2013.01); *H01L 25/0652* (2013.01); *H01L 25/0657* (2013.01); *H01L 25/50* (2013.01); *H01L 21/561* (2013.01); *H01L 23/02* (2013.01); *H01L 23/04* (2013.01); *H01L 23/053* (2013.01); *H01L 23/055* (2013.01); *H01L 23/057* (2013.01); *H01L 23/08* (2013.01);
(Continued)

(58) Field of Classification Search
CPC .. H01L 25/043; H01L 25/074; H01L 25/0756
USPC .................................................. 257/686, 777
See application file for complete search history.

(56) References Cited

U.S. PATENT DOCUMENTS 6,365,963 B1 *   4/2002   Shimada .................... 257/686
6,492,726 B1 *   12/2002  Quek et al. ................. 257/723
(Continued)

FOREIGN PATENT DOCUMENTS

JP   2008182225 A   8/2008
JP   2008211213 A   9/2008
(Continued)

*Primary Examiner* — Colleen Matthews
*Assistant Examiner* — William Harriston
(74) *Attorney, Agent, or Firm* — Harness, Dickey & Pierce, PLC

(57) ABSTRACT

A fan-out wafer level package may include at least two semiconductor chips; an insulating layer covering portions of a first semiconductor chip; a mold layer covering portions of a second semiconductor chip; a redistribution line pattern in the insulating layer; and/or an external terminal on the insulating layer. The first semiconductor chip may be stacked relative to the second semiconductor chip. The redistribution line pattern may be electrically connected to the at least two semiconductor chips. The external terminal may be electrically connected to the redistribution line pattern. A fan-out wafer level package may include at least three semiconductor chips; an insulating layer covering portions of first semiconductor chips; a mold layer covering portions of a second semiconductor chip; a redistribution line pattern in the insulating layer; and/or an external terminal on the insulating layer. The first semiconductor chips may be stacked relative to the second semiconductor chip.

20 Claims, 18 Drawing Sheets

(51) Int. Cl.
  *H01L 23/538*   (2006.01)
  *H01L 25/065*   (2006.01)
  *H01L 25/00*    (2006.01)
  *H01L 23/13*    (2006.01)
  *H01L 23/12*    (2006.01)
  *H01L 23/057*   (2006.01)
  *H01L 23/055*   (2006.01)
  *H01L 23/24*    (2006.01)
  *H01L 23/053*   (2006.01)
  *H01L 23/02*    (2006.01)
  *H01L 23/04*    (2006.01)
  *H01L 23/495*   (2006.01)
  *H01L 23/08*    (2006.01)
  *H01L 23/492*   (2006.01)
  *H01L 23/31*    (2006.01)
  *H01L 23/00*    (2006.01)

(52) U.S. Cl.
  CPC .............. *H01L 23/12* (2013.01); *H01L 23/13* (2013.01); *H01L 23/24* (2013.01); *H01L 23/3128* (2013.01); *H01L 23/34* (2013.01); *H01L 23/4926* (2013.01); *H01L 23/49575* (2013.01); *H01L 24/13* (2013.01); *H01L 2224/0401* (2013.01); *H01L 2224/04105* (2013.01); *H01L 2224/12105* (2013.01); *H01L 2224/131* (2013.01); *H01L 2224/13022* (2013.01); *H01L 2224/24011* (2013.01); *H01L 2224/24146* (2013.01); *H01L 2224/32145* (2013.01); *H01L 2224/73209* (2013.01); *H01L 2224/73253* (2013.01); *H01L 2224/73267* (2013.01); *H01L 2224/82031* (2013.01); *H01L 2224/82101* (2013.01); *H01L 2224/96* (2013.01); *H01L 2225/06524* (2013.01); *H01L 2225/06548* (2013.01); *H01L 2225/06562* (2013.01); *H01L 2225/06568* (2013.01); *H01L 2225/06586* (2013.01)

(56) References Cited

U.S. PATENT DOCUMENTS

| | | | |
|---|---|---|---|
| 6,607,938 | B2 | 8/2003 | Kwon et al. |
| 7,196,408 | B2 | 3/2007 | Yang et al. |
| 7,327,032 | B2 | 2/2008 | Yoon |
| 2003/0017647 | A1 | 1/2003 | Kwon et al. |
| 2003/0030151 | A1* | 2/2003 | Morozumi .................... 257/777 |
| 2006/0091514 | A1 | 5/2006 | Yang et al. |
| 2006/0231950 | A1 | 10/2006 | Yoon |
| 2008/0150157 | A1* | 6/2008 | Nishimura et al. ........... 257/777 |
| 2008/0197469 | A1 | 8/2008 | Yang et al. |
| 2009/0230533 | A1 | 9/2009 | Hoshino et al. |
| 2010/0193930 | A1* | 8/2010 | Lee ............................... 257/686 |
| 2010/0314739 | A1 | 12/2010 | Kaufmann et al. |
| 2011/0068427 | A1 | 3/2011 | Paek et al. |
| 2011/0079890 | A1* | 4/2011 | Song et al. .................... 257/686 |
| 2011/0156239 | A1 | 6/2011 | Jin |
| 2011/0157853 | A1 | 6/2011 | Goh |
| 2011/0177654 | A1 | 7/2011 | Lee et al. |

FOREIGN PATENT DOCUMENTS

| | | |
|---|---|---|
| JP | 2009071095 A | 4/2009 |
| KR | 100394808 B1 | 8/2003 |
| KR | 100618892 B1 | 8/2006 |
| KR | 100824160 B1 | 4/2008 |
| KR | 20080077934 A | 8/2008 |
| KR | 20090007120 A | 1/2009 |

* cited by examiner

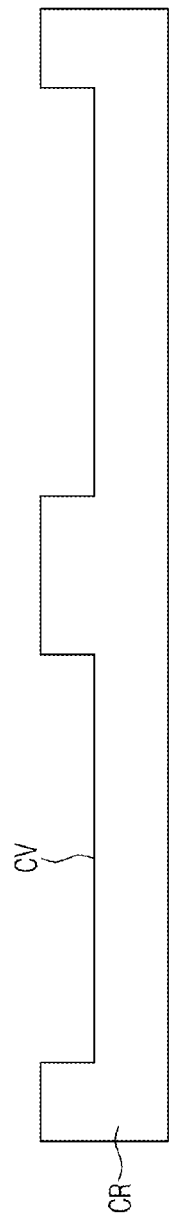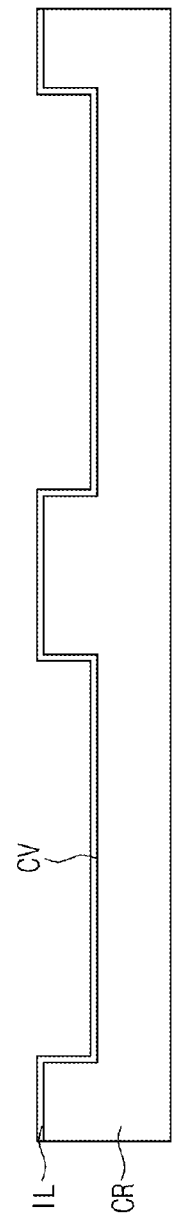

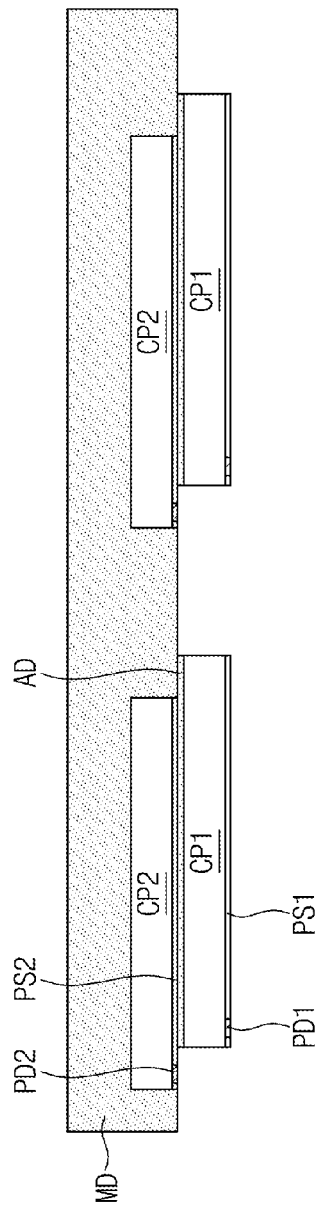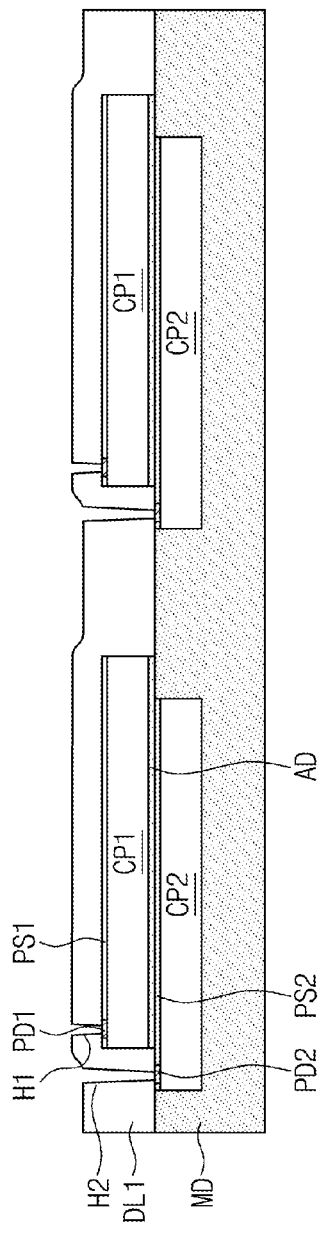

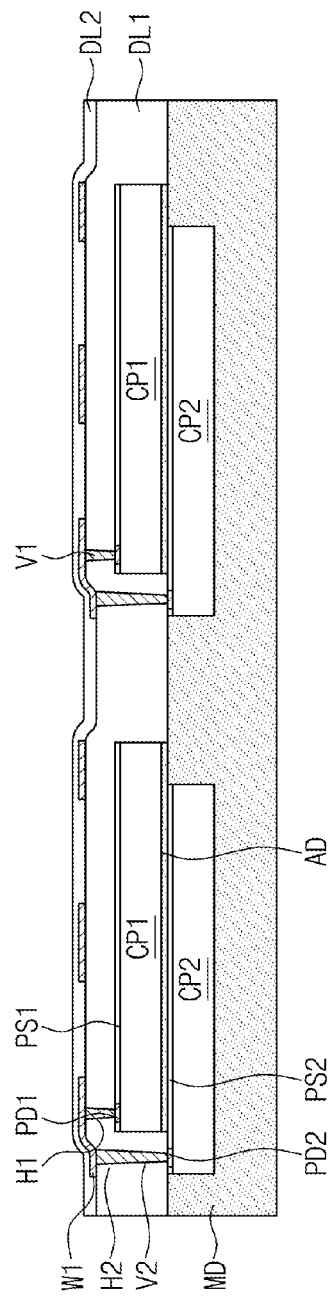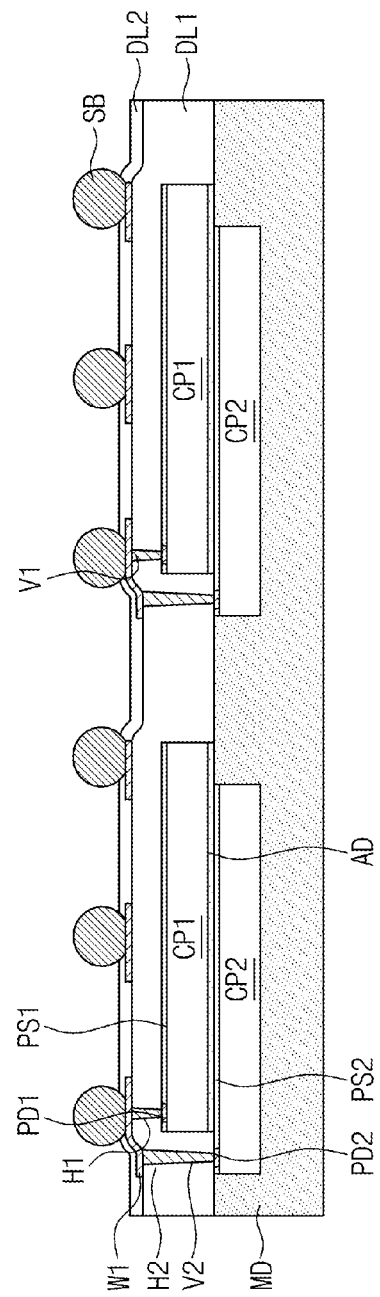

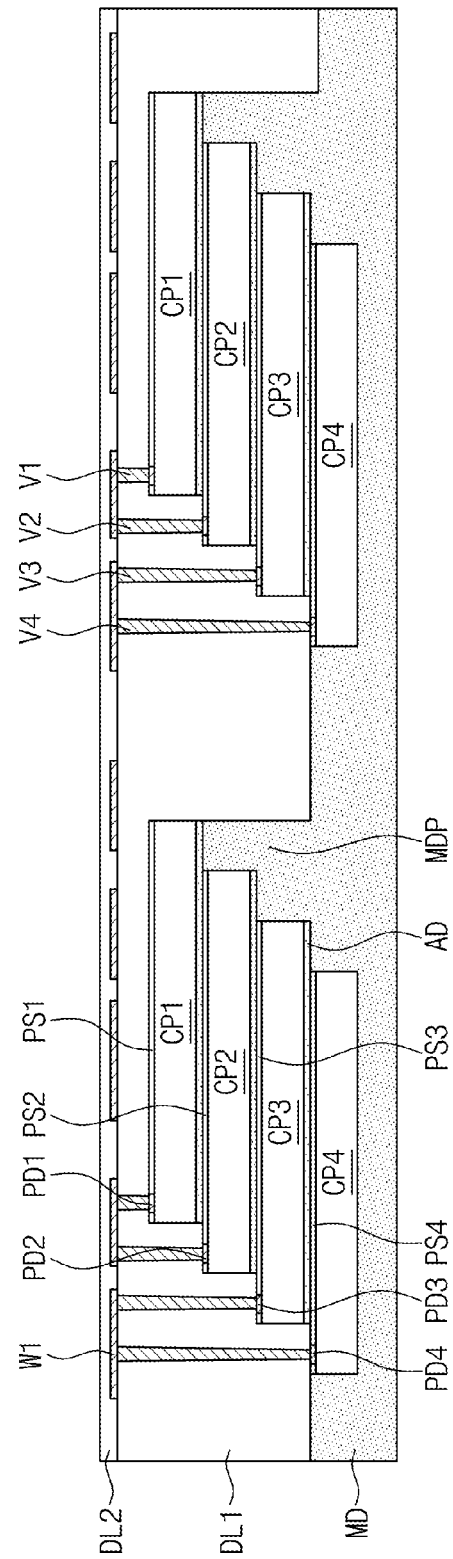

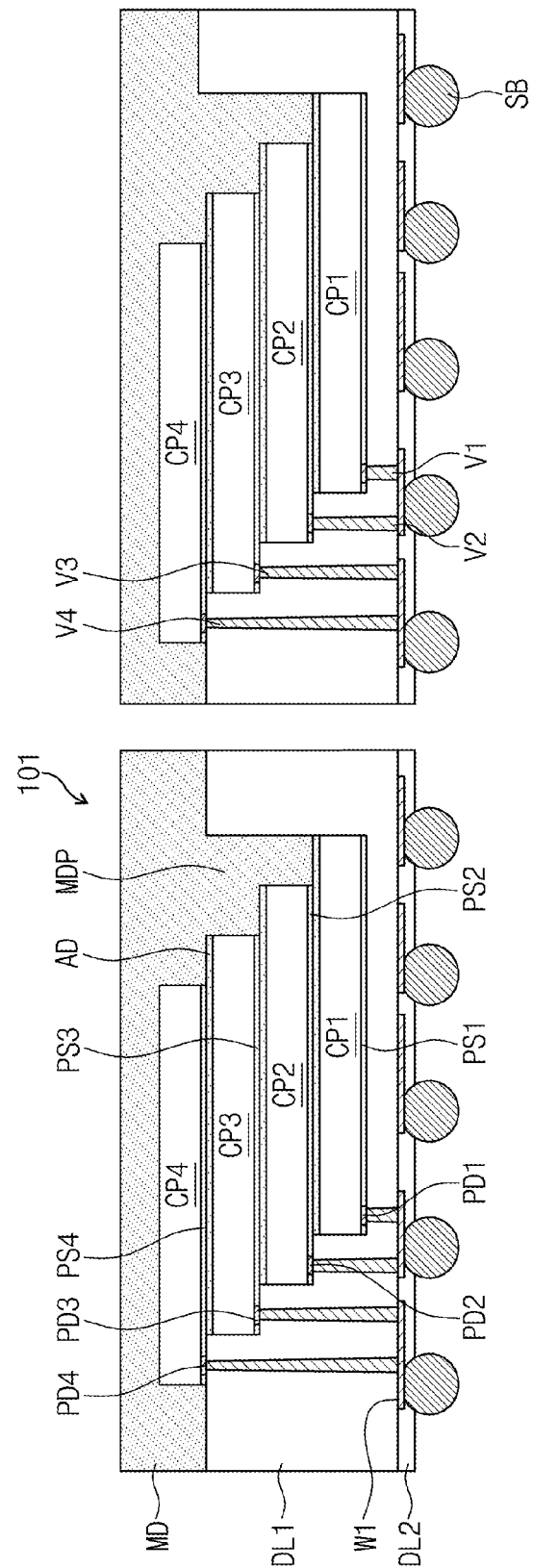

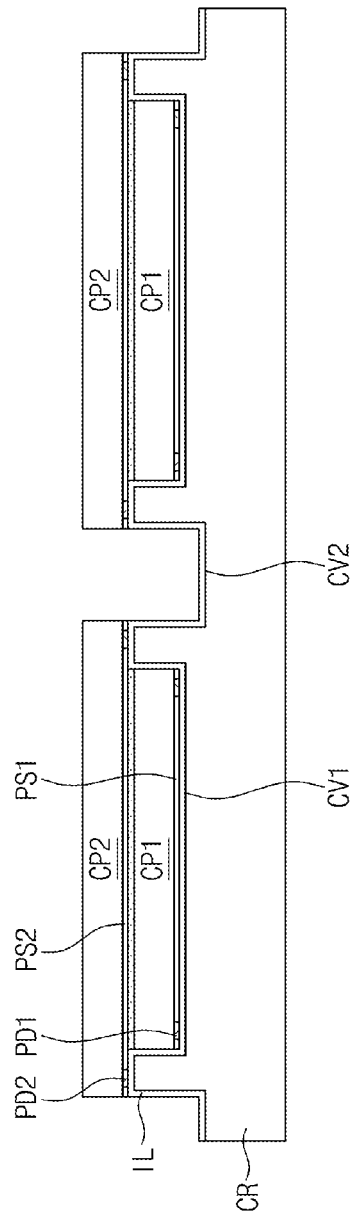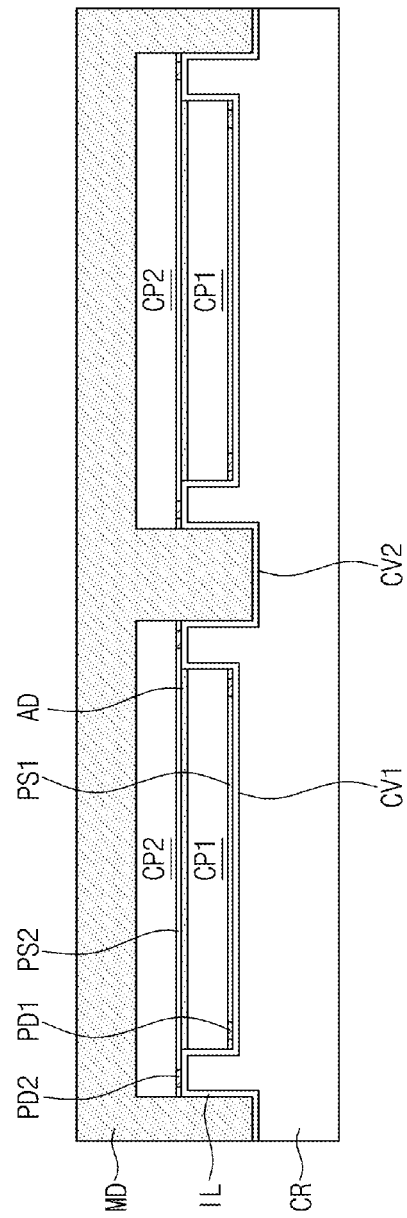

METHODS OF FABRICATING FAN-OUT WAFER LEVEL PACKAGES AND PACKAGES FORMED BY THE METHODS

CROSS-REFERENCE TO RELATED APPLICATION(S)

This application claims priority from Korean Patent Application No. 10-2011-0131696, filed on Dec. 9, 2011, in the Korean Intellectual Property Office (KIPO), the entire contents of which are incorporated herein by reference.

BACKGROUND

1. Technical Field

Example embodiments of the inventive concept may relate to methods of fabricating fan-out wafer level packages and/or packages formed by the methods.

2. Description of the Related Art

A packaging process manufacturing a semiconductor package means a series of processes that connect a semiconductor chip to external connection terminals and seal the semiconductor chip for protecting the semiconductor chip from an external impact.

The semiconductor packages have been variously developed for purposes of small size, light weight, and low fabrication cost with the development of an electronic industry. Additionally, as widely used in various application fields such as a digital display device, a MP3 player, a mobile phone, and a mass storage device, various kinds of semiconductor packages are proposed. For example, the various kinds of semiconductor packages may include a ball grid array (BGA) package and a wafer level package (WLP), etc.

The semiconductor chip may be mounted on a printed circuit board and a molding process may be performed. And then solder balls may be bonded on a bottom surface of the printed circuit board, thereby forming the BGA package. The BGA package positively needs the mold process. Additionally, since the BGA package uses the printed circuit board, it is limited that a thickness of the BGA package is reduced.

For solving the problems of the BGA package, the WLPs have been proposed. The WLP does not need the molding process. A redistribution line pattern may be formed on a bottom surface of the semiconductor chip and solder balls may be directly on the redistribution line pattern, thereby forming the WLP. Thus, since the WLP does not need the molding process and the printed circuit board, a structure of the WLP may be simple and a thickness of the WLP may be reduced.

Meanwhile, as the semiconductor chip becomes more and more integrated, a size of the semiconductor chip may become more and more reduced. However, the intervals between the solder balls may be fixed by an international semiconductor standard. Thus, it is difficult to bond a desired number of the solder balls to the WLP. Additionally, as the size of the semiconductor chip becomes reduced, it is difficult to handle and test the WLP. Furthermore, as the size of the semiconductor chip becomes reduced, it may be required to variously change a board on which the WLP is mounted.

For solving the above problems, a fan-out WLP have been proposed. In the fan-out WLP, a mold layer may be disposed around the semiconductor chip, the redistribution line pattern may also be formed on a bottom surface of the mold layer, and some of the solder balls may be bonded to the redistribution line pattern under the mold layer.

SUMMARY

Example embodiments of the inventive concept may provide methods of fabricating fan-out wafer level packages capable of stably realizing various stack structures.

Example embodiments of the inventive concept may also provide fan-out wafer level packages having various stack structures.

In some example embodiments, a method of fabricating a fan-out wafer level package may comprise preparing a receiving part in which a cavity is formed; conformally forming an isolation layer on the receiving part; disposing a first semiconductor chip in the cavity; disposing at least one second semiconductor chip on the first semiconductor chip; forming a mold layer covering the second semiconductor chip, the mold layer having a width greater than a width of the second semiconductor chip; removing the isolation layer to separate the receiving part from the first semiconductor chip and to expose the first semiconductor chip at a same time; forming an insulating layer covering the exposed first semiconductor chip; forming a redistribution line pattern that penetrates the insulating layer so as to electrically connect the first semiconductor chip to the at least one second semiconductor chip; and/or forming an external terminal electrically connected to the redistribution line pattern on the insulating layer.

In some example embodiments, the receiving part may be a carrier or an assistance mold.

In some example embodiments, the isolation layer may be a double-sided adhesive tape or an adhesive layer.

In some example embodiments, disposing the first semiconductor chip in the cavity may comprise disposing the first semiconductor chip so that one sidewall of the first semiconductor chip is adjacent to at least one inner sidewall of the cavity.

In some example embodiments, at least one inner sidewall of the cavity may be formed in a stepped-shape. End portions of the first semiconductor chip and the at least one second semiconductor chip may be in a stepped-shape in the cavity.

In some example embodiments, at least two first semiconductor chips may be in the cavity.

In some example embodiments, the first semiconductor chip may include a first pad and the at least one second semiconductor chip includes a second pad. The first semiconductor chip may be configured to bring the first pad into contact with the isolation layer. The at least one second semiconductor chip may be configured to bring the second pad into contact with the isolation layer.

In some example embodiments, a fan-out wafer level package may comprise at least two semiconductor chips sequentially stacked; an insulating layer covering a bottom surface and one sidewall of a lowermost semiconductor chip of the at least two semiconductor chips; a mold layer covering a top surface of an uppermost semiconductor chip of the at least two semiconductor chips, the mold layer having a width greater than widths of the at least two semiconductor chips; a redistribution line pattern in the insulating layer, the redistribution line pattern electrically connected to the at least two semiconductor chips; and/or an external terminal on the insulating layer, the external terminal in contact with the redistribution line pattern.

In some example embodiments, end portions of the at least two semiconductor chips may be formed in a stepped-shape. The mold layer may extend to cover both sidewalls of the uppermost semiconductor chip. The insulating layer may extend to cover both sidewalls of the lowermost semiconductor chip.

In some example embodiments, the mold layer may comprise a protrusion extending to be in contact with one end portion of a semiconductor chip under the uppermost semiconductor chip. The insulating layer may extend to be in contact with another end portion of the semiconductor chip under the uppermost semiconductor chip.

In some example embodiments, the insulating layer may extend to cover a sidewall of the protrusion.

In some example embodiments, the uppermost semiconductor chip may have a width greater than a width of the lowermost semiconductor chip, so that the uppermost semiconductor chip covers an entire top surface of the lowermost semiconductor chip. The insulating layer may extend to cover both sidewalls of the lowermost semiconductor chip. The mold layer may extend to cover a sidewall of the insulating layer.

In some example embodiments, the uppermost semiconductor chip may cover at least two lowermost semiconductor chips of the at least two semiconductor chips adjacent to each other simultaneously. The insulating layer may fill a space between the at least two lowermost semiconductor chips adjacent to each other.

In some example embodiments, the mold layer may extend to covers sidewalls of the at least two lowermost semiconductor chips adjacent to each other simultaneously.

In some example embodiments, the insulating layer may extend to cover both sidewalls of the uppermost semiconductor chip.

In some example embodiments, a fan-out wafer level package may comprise at least two semiconductor chips; an insulating layer covering portions of a first semiconductor chip of the at least two semiconductor chips; a mold layer covering portions of a second semiconductor chip of the at least two semiconductor chips; a redistribution line pattern in the insulating layer; and/or an external terminal on the insulating layer. The first semiconductor chip may be stacked relative to the second semiconductor chip. The redistribution line pattern may be electrically connected to the at least two semiconductor chips. The external terminal may be electrically connected to the redistribution line pattern.

In some example embodiments, the insulating layer may cover portions of the second semiconductor chip.

In some example embodiments, the insulating layer may cover portions of the at least two semiconductor chips.

In some example embodiments, the mold layer may cover portions of the first semiconductor chip.

In some example embodiments, the mold layer may cover portions of the at least two semiconductor chips.

In some example embodiments, the insulating layer may cover sidewall portions of the at least two semiconductor chips.

In some example embodiments, the mold layer may cover sidewall portions of the at least two semiconductor chips.

In some example embodiments, a fan-out wafer level package may comprise at least three semiconductor chips; an insulating layer covering portions of first semiconductor chips of the at least three semiconductor chips; a mold layer covering portions of a second semiconductor chip of the at least three semiconductor chips; a redistribution line pattern in the insulating layer; and/or an external terminal on the insulating layer. The first semiconductor chips may be stacked relative to the second semiconductor chip. The redistribution line pattern may be electrically connected to the at least three semiconductor chips. The external terminal may be electrically connected to the redistribution line pattern.

In some example embodiments, the insulating layer may cover portions of the second semiconductor chip.

In some example embodiments, the insulating layer may cover portions of the at least three semiconductor chips.

In some example embodiments, the mold layer may cover portions of the first semiconductor chips.

In some example embodiments, the mold layer may cover portions of the at least three semiconductor chips.

BRIEF DESCRIPTION OF THE DRAWINGS

The above and/or other aspects and advantages will become more apparent and more readily appreciated from the following detailed description of example embodiments, taken in conjunction with the accompanying drawings, in which:

FIGS. 1 to 9 are cross-sectional views illustrating a method of fabricating a fan-out wafer level package according to some example embodiments of the inventive concept;

FIGS. 10 to 15 are cross-sectional views illustrating a method of fabricating a fan-out wafer level package according to some example embodiments of the inventive concept;

FIGS. 16 to 20 are cross-sectional views illustrating a method of fabricating a fan-out wafer level package according to some example embodiments of the inventive concept;

DETAILED DESCRIPTION

Figure 3:
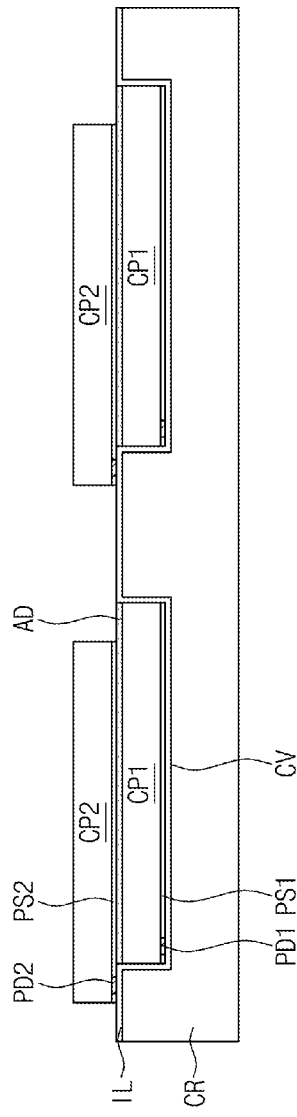

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

First Embodiment

FIGS. 1 to 9 are cross-sectional views illustrating a method of fabricating a fan-out wafer level package according to some example embodiments of the inventive concept.

Referring to FIG. 1, a receiving part CR in which a cavity CV is formed may be prepared. The receiving part CR may be a carrier or an assistance mold disposed on the carrier. The receiving part CR may be formed of at least one of various materials such as glass, plastic, and metal. The cavity CV may be formed in the receiving part CR using a molding process, a laser process, or an etching process. In the present embodiment, the cavity CV may provide a space corresponding to a size of a first semiconductor chip CP1 which will be disposed in the cavity CV.

Referring to FIG. 2, an isolation layer IL is conformally formed on an entire surface of the receiving part CR on which the cavity CV is formed. The isolation layer IL may be a double-sided adhesive tape or an adhesive layer. When the isolation layer IL is the double-sided adhesive tape, the isolation layer IL may adhere on the receiving part CR by a lamination processing using a vacuum. When the isolation layer IL is the adhesive layer, the isolation layer IL may be formed by coating an adhesive material.

Referring to FIG. 3, a semiconductor chip CP1 is disposed in the cavity CV. When the isolation layer IL is the double-sided adhesive tape or the adhesive layer, the first semiconductor chip CP1 may adhere to the isolation layer IL in the cavity CV. The first semiconductor chip CP1 may include a first chip passivation layer PS1 and a first pad PD1. The first semiconductor chip CP1 may be disposed to bring the first pad PD1 into contact with the isolation layer IL. An adhesive layer AD is formed on the first semiconductor chip CP1. The adhesive layer AD may be a double-side adhesive tape. A second semiconductor chip CP2 adheres on the first semiconductor chip CP1 using the adhesive layer AD. The second semiconductor chip CP2 may be disposed on a top surface of the receiving part CR outside the cavity CV. The second semiconductor chip CP2 may include a second chip passivation layer PS2 and a second pad PD2. The second semiconductor chip CP2 may be disposed to bring the second pad PD2 into contact with the isolation layer IL. End portions of the first semiconductor chip CP1 and the second semiconductor chip CP2 may be formed in a stepped-shape. The first pad PD1 and the second pad PD2 may be respectively disposed at the end portions of the first and second semiconductor chips CP1 and CP2 constituting the stepped-shape. The cavity CV may function as a supporter preventing the first and second semiconductor chips CP1 and CP2 from falling. And the cavity CV may protect the first and second pads PD1 and PD2.

Figure 4:
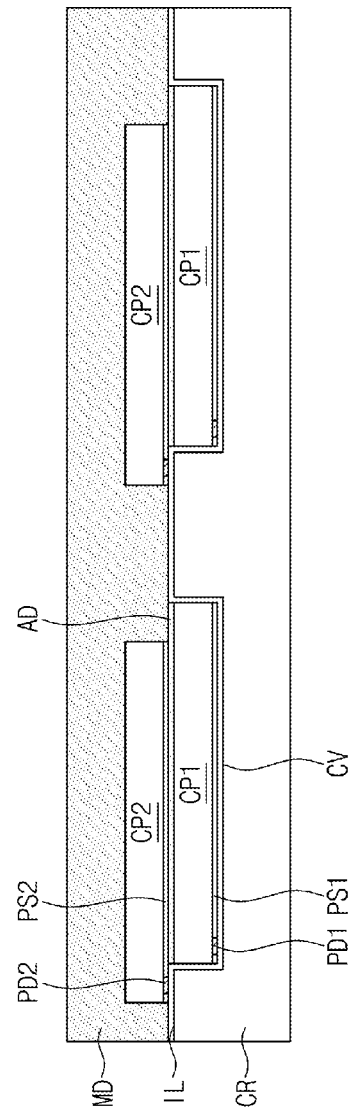

Referring to FIG. 4, a mold layer MD is formed on the receiving part CR. The mold layer MD may be formed of epoxy mold compound material. The mold layer MD is formed to cover a top surface and sidewalls of the second semiconductor chip CP2. Since the first and second pads PD1 and PD2 are disposed to be in contact with the isolation layer IL, the first and second pads PD1 and PD2 are not in contact with the mold layer MD.

Referring to FIG. 5, the isolation layer IL is selectively removed to separate the first semiconductor chip CP1 from the receiving part CR. When the isolation layer IL is the double-sided adhesive tape, for example, a heat of about 170 degrees Celsius or more may be applied to the isolation layer IL. Thus, the double-sided adhesive tape may lose an adhesive force and then be separated from the first semiconductor chip CP1. Here, a hardening temperature of the adhesive layer AD may be controlled, so that the adhesive layer is not separated from the first and second semiconductor chips CP1 and CP2 when the isolation layer IL is separated from the first semiconductor chip CP1. In other embodiments, when the receiving part CR is formed of glass, ultraviolet rays may be irradiated into a back side of the receiving part CR so as to harden an adhesive of the double-sided adhesive tape. Thus, the double-sided adhesive tape may lose an adhesive force and then be separated from the first semiconductor chip CP1. In still other embodiments, the isolation layer IL may be dissolved using chemicals and be removed. As a result, it is possible to expose a bottom surface and sidewalls of the first semiconductor chip CP1, a portion of a bottom surface of the second semiconductor chip CP2, and a bottom surface of the mold layer MD. Thus, the first pad PD1 and the second pad PD2 may be exposed.

Referring to FIG. 6, in the state that the receiving part CR is separated, the resultant structure of FIG. 5 is overturned. Thus, the first semiconductor chip CP1 is located on the second semiconductor chip CP2. And then a first insulating layer DL1 is formed on the mold layer MD. The first insulating layer DL1 is formed to be in contact with the first and second pads PD1 and PD2. The first insulating layer DL1 may be formed of an inorganic insulating layer (e.g., a silicon oxide layer, a silicon nitride layer, a silicon oxynitride layer) or a polymer insulating layer (e.g., polyimide organic material). The first insulating layer DL1 may be formed by a spin coating process, a physical vapor deposition (PVD) process, a chemical vapor deposition (CVD) process, a sputtering process, an atomic layer deposition (ALD) process, and/or a printing process. When the first insulating layer DL1 is formed by the spin coating process, a little step difference may occur on a top surface of the first insulating layer DL1, however, the first insulating layer DL1 may be substantially planarized. When the first insulating layer DL1 is formed of a deposition process, step difference may occur on the top surface of the first insulating layer DL1. Thus, a planarization process may be additionally performed on the first insulating layer DL1.

Continuously referring to FIG. 6, the first insulating layer DL1 is patterned to form a first redistribution line via-hole H1 and a second redistribution line via-hole H2 exposing the first pad PD1 and the second pad PD2, respectively. The first and second redistribution line via-holes H1 and H2 may be formed using a photolithography process and an etching process. If the first and second pads PD1 and PD2 are in contact with the mold layer MD, for the formation of the first and second redistribution line via-holes H1 and H2, it may be required to remove portions of the mold layer MD one by one by a laser. Sophistication of this method may be worse than that of the photolithography process and the etching process. Additionally, all of the first and second redistribution line via-holes H1 and H2 may be formed simultaneously by one photolithography process and one etching process. Thus, the photolithography process and the etching process may quickly form the first and second redistribution line via-holes H1 and H2 as compared with the method using the laser. As a result, according to some example embodiments of the inventive concept, the fan-out wafer level package with improved reliability may be more quickly fabricated.

Referring to FIG. 7, the first redistribution line via-hole H1 and the second redistribution line via-hole H2 are filled with a metal layer, thereby forming a first redistribution line via V1 and a second redistribution line via V2. Redistribution line patterns W1 are formed on the first insulating layer DL1. The redistribution line patterns W1 may be in contact with the first and second redistribution line vias V1 and V2. The redistribution line patterns W1 may function as interconnections and pads. A second insulating layer DL2 is formed to cover the redistribution line patterns W1. The second insulating layer DL2 may be formed of an inorganic insulating layer (e.g., a silicon oxide layer, a silicon nitride layer, a silicon oxynitride layer) or a polymer insulating layer (e.g., polyimide organic material).

Referring to FIG. 8, the second insulating layer DL2 is patterned to partially expose the redistribution line patterns W1 and then solder balls SB are bonded to the exposed redistribution line patterns W1.

Figure 9:
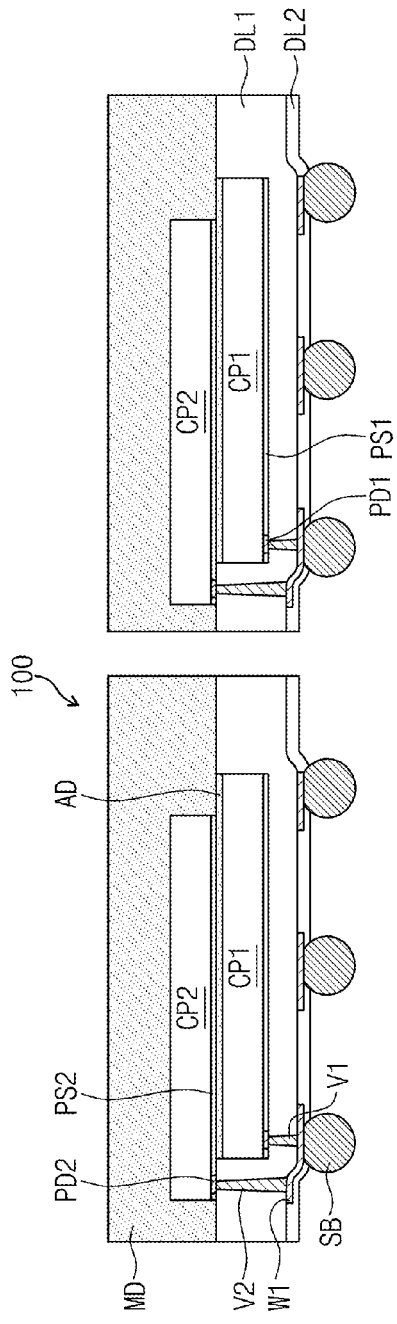

Referring to FIG. 9, a singulation process is performed to cut the mold layer MD and the first and second insulating layers DL1 and DL2, so that fan-out wafer level packages 100 are separated from each other. Thus, the fan-out wafer level packages 100 are fabricated.

First and second semiconductor chips CP1 and CP2 are stacked in the fan-out wafer level package 100 of FIG. 9, and the end portions of the first and second semiconductor chips CP1 and CP2 are formed in the stepped-shape. The first and second pads PD1 and PD2 are disposed on the end portions formed in the stepped-shape. First and second semiconductor chips CP1 and CP2 may be the same kind of chips or different kinds of chips. Additionally, first and second semiconductor chips CP1 and CP2 may be logic chips or memory chips. The bottom surface and sidewalls of the first semiconductor chip CP1 disposed at the lowermost level are covered by the first insulating layer DL1. The top surface and sidewalls of the second semiconductor chip CP2 disposed at the uppermost level are covered by the mold layer MD. A width of the mold layer MD is greater than widths of the first and second semiconductor chips CP1 and CP2. The first semiconductor chip CP1 and the second semiconductor chip CP2 are electrically connected to each other by the redistribution line patterns W1.

Second Embodiment

FIGS. 10 to 15 are cross-sectional views illustrating a method of fabricating a fan-out wafer level package according to some example embodiments of the inventive concept.

Figure 10:
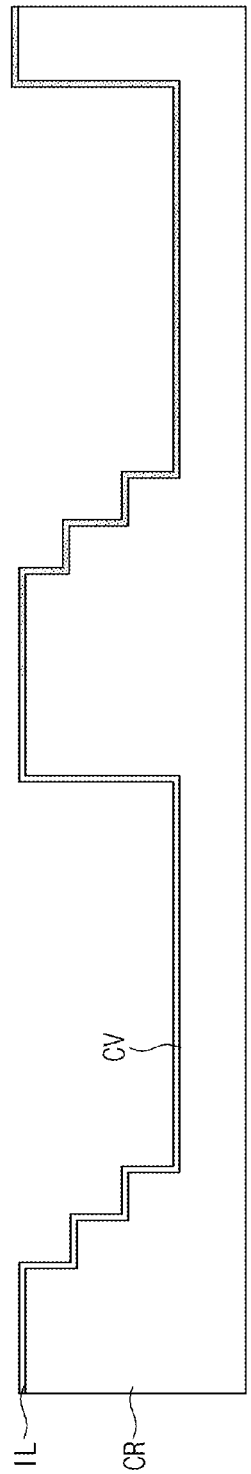

Referring to FIG. 10, a receiving part CR having a cavity CV is prepared. The receiving part CR may be a carrier or an assistance mold disposed on the carrier. The receiving part CR may be formed of at least one of various materials such as glass, plastic, and metal. One inner sidewall of the cavity CV may have a stepped-shape. The cavity CV may provide a space having a depth and a size capable of receiving a plurality of semiconductor chips. An isolation layer IL is conformally formed on the receiving part CR having the cavity CV. The isolation layer IL may be a double-sided adhesive tape or an adhesive layer.

Figure 11:
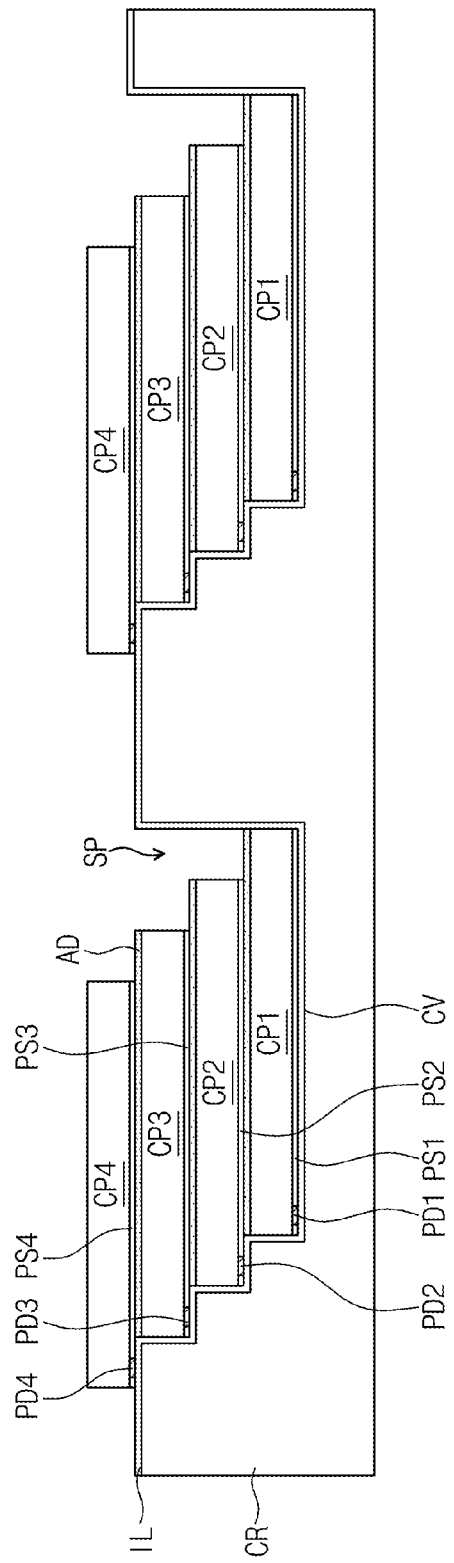

Referring to FIG. 11, first to third semiconductor chips CP1, CP2, and CP3 are disposed in the cavity CV. The first semiconductor chip CP1 may include a first chip passivation layer PS1 and a first pad PD1. The second semiconductor chip CP2 may include a second chip passivation layer PS2 and a second pad PD2. The third semiconductor chip CP3 may include a third chip passivation layer PS3 and a third pad PD3. The first to third semiconductor chips CP1, CP2, and CP3 may be disposed to be aligned with the one inner sidewall having the stepped-shape of the cavity CV. The first to third pads PD1, PD2, and PD3 are respectively disposed at one end portions of the first to third semiconductor chips CP1, CP2, and CP3 disposed on the one inner sidewall having the stepped-shape of the cavity CV. The first to third pads PD1, PD2, and PD3 are disposed to be in contact with the isolation layer IL. If the first to third semiconductor chips CP1, CP2, and CP3 have the same size, another end portions of the first to third semiconductor chips CP1, CP2, and CP3 are also formed in a stepped-shape. Here, an empty region SP, which is not filled with the second and third semiconductor chips CP2 and CP3, may remain in the cavity CV. The cavity CV may function as a supporter preventing the first to third semiconductor chips CP1, CP2, and CP3 from falling. And the cavity CV may protect the first to third pads PD1, PD2, and PD3. A fourth semiconductor chip CP4 is disposed on the third semiconductor chip CP3. The fourth semiconductor chip CP4 may include a fourth chip passivation layer PS4 and a fourth pad PD4. The fourth semiconductor chip CP4 may be disposed in order that the fourth pad PD4 is in contact with the isolation layer IL and one end portions of the third and fourth semiconductor chips CP3 and CP4 are formed in a stepped-shape. Adhesive layers AD are disposed between the first to fourth semiconductor chips CP1, CP2, CP3, and CP4, so that the first to fourth semiconductor chips CP1, CP2, CP3, and CP4 are adhered and fixed to each other.

Figure 12:
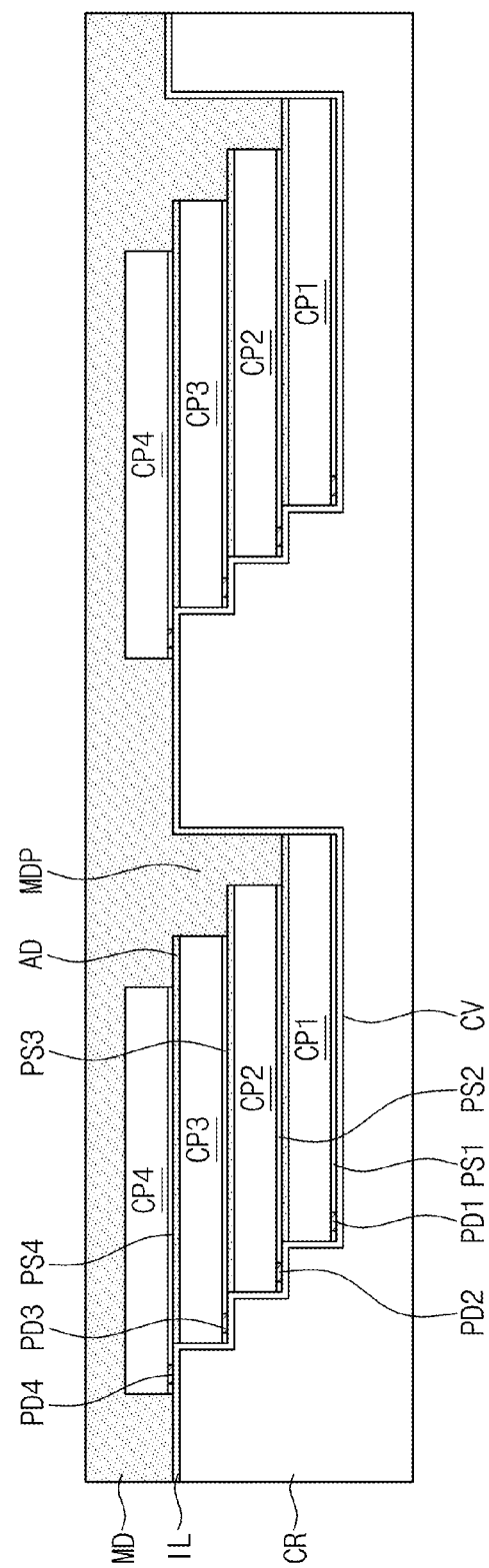

Referring to FIG. 12, a mold layer MD is formed on the receiving part CR. The mold layer MD may be formed of epoxy mold compound material. The mold layer MD covers a top surface and sidewalls of the fourth semiconductor chip CP4 disposed at the uppermost level. Additionally, the mold layer MD fills the empty region SP in the cavity CV. In other words, the mold layer MD include a protrusion MDP covering the end portions of the first to third semiconductor chips CP1, CP2, and CP3 which are exposed by the empty region SP.

Figure 13:
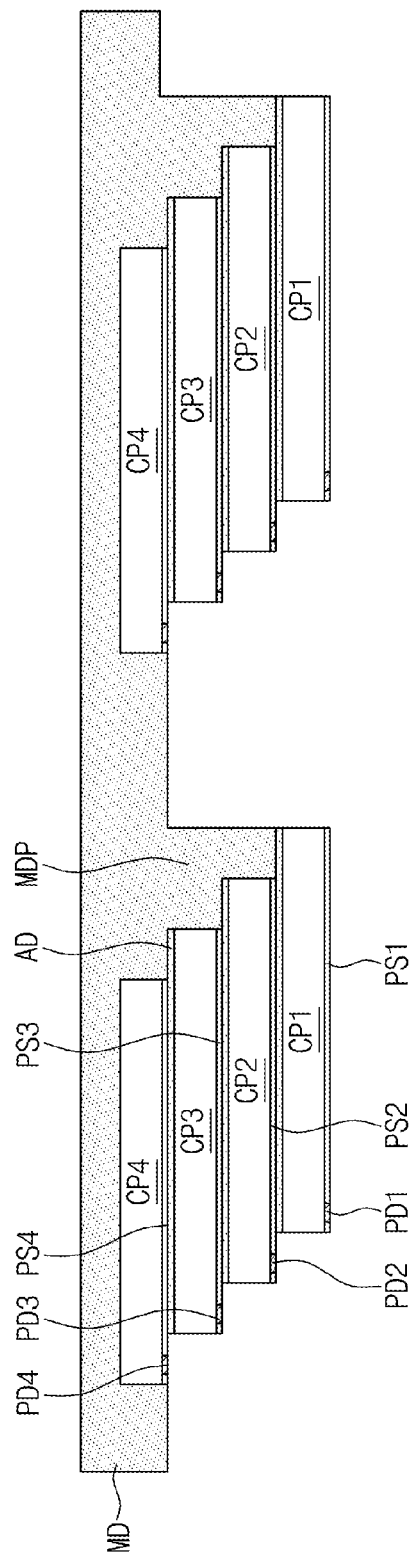

Referring to FIG. 13, the isolation layer IL is selectively removed to separate the receiving part CR from the first to third semiconductor chips CP1, CP2, and CP3. Thus, it may be possible to expose a bottom surface and sidewalls of the first semiconductor chip CP1, portions of bottom surfaces and some of sidewalls of the second and third semiconductor chips CP2 and CP3, a portion of a bottom surface of the fourth semiconductor chip CP4, a bottom surface of the mold layer MD, and a sidewall of the protrusion MDP. Additionally, the first to fourth pads PD1, PD2, PD3, and PD4 may be exposed.

Referring to FIG. 14, in the state that the receiving part CR is separated, the resultant structure of FIG. 13 is overturned. And then a first insulating layer DL1 is formed on the mold layer MD. The first insulating layer DL1 covers a top surface and sidewalls of the first semiconductor chip CP1, end portions of the second to fourth semiconductor chips CP2, CP3, and CP4, the sidewall of the protrusion MDP, and a top surface of the mold layer MD. The first insulating layer DL1 is formed to be in contact with the first to fourth pads PD1, PD2, PD3, and PD4. First to fourth redistribution line vias V1, V2, V3, and V4 are formed to penetrate the first insulating layer DL1. The first to fourth redistribution line vias V1, V2, V3, and V4 are in contact with the first to fourth pads PD1, PD2, PD3, and PD4, respectively. Redistribution line patterns W1 are formed on the first insulating layer DL1. The redistribution line patterns W1 are electrically connected to the first to fourth redistribution line vias V1, V2, V3, and V4. A second insulating layer DL2 is formed on the first insulating layer DL1 and the redistribution line patterns W1.

Referring to FIG. 15, portions of the second insulating layer DL2 are removed to partially expose the redistribution line patterns W1 and then solder balls SB are bonded to the exposed redistribution line patterns W1. A singulation process is performed, so that fan-out wafer level packages 101 are separated from each other.

Referring to FIG. 15, in the fan-out wafer level package 101 according to the present embodiment, first to fourth semiconductor chips CP1, CP2, CP3, and CP4 are stacked and the end portions thereof are formed in the stepped-shape. The first to fourth pads PD1, PD2, PD3, and PD4 are disposed on the end portions formed in the stepped-shape, respectively. The first to fourth semiconductor chips CP1, CP2, CP3, and CP4 may be the same kind of chips or different kinds of chips. The first to fourth semiconductor chips CP1, CP2, CP3, and CP4 are electrically connected to each other the redistribution line patterns W1. The top surface and sidewalls of the fourth semiconductor chip CP4 disposed at the uppermost level are covered by the mold layer MD. A width of the mold layer MD is wider than widths of the first to fourth semiconductor chips CP1, CP2, CP3, and CP4. The mold layer MD includes the protrusion MDP covering one end portions of the first to fourth semiconductor chips CP1, CP2, CP3, and CP4. A bottom surface and sidewalls of the first semiconductor chip CP1 disposed at the lowermost level are covered by the first insulating layer DL1. The first insulating layer DL1 extends to cover another end portions of the first to fourth semiconductor chips CP1, CP2, CP3, and CP4. Additionally, the first insulating layer DL1 may cover the sidewall of the protrusion MDP.

The other methods and the other structure may be the same as or similar to those in some other example embodiments of the inventive concept.

In the present embodiment, the stacking method/the stack structure was explained using four semiconductor chips. However, example embodiments of the inventive concept is not limited to the number of the stacked semiconductor chips.

Third Embodiment

FIGS. 16 to 20 are cross-sectional views illustrating a method of fabricating a fan-out wafer level package according to some example embodiments of the inventive concept.

Referring to FIG. 16, a receiving part CR in which a first cavity CV1 and a second cavity CV2 are formed is prepared. The receiving part CR may be a carrier or an assistance mold disposed on the carrier. The receiving part CR may be formed of at least one of various materials such as glass, plastic, and metal. The first cavity CV1 may be used for receiving a semiconductor chip and the second cavity CV2 may be used as a separation region between neighboring packages. An isolation layer IL is conformally formed on the receiving part CR having the first and second cavities CV1 and CV2. A first semiconductor chip CP1 is disposed in the first cavity CV1. And then a second semiconductor chip CP2 is disposed on the first semiconductor chip CP1 with an adhesive layer AD therebetween. The second semiconductor chip CP2 is disposed outside the first cavity CV1. The second semiconductor chip CP2 may have a width greater than a width of the first semiconductor chip CP1. The first semiconductor chip CP1 may include a first chip passivation layer PS1 and a first pad PD1. The second semiconductor chip CP2 may include a second chip passivation layer PS2 and a second pad PD2. The first pad PD1 of the first semiconductor chip CP1 and the second pad PD2 of the second semiconductor chip CP2 are disposed to be in contact with the isolation layer IL.

Referring to FIG. 17, a mold layer MD is formed on the receiving part CR. The mold layer MD covers a top surface and sidewalls of the second semiconductor chip CP2 and fills the second cavity CV2.

Figure 18:
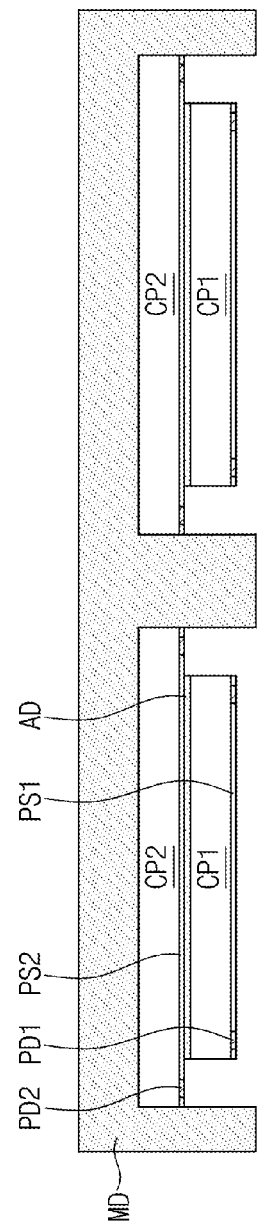

Referring to FIG. 18, the isolation layer IL is selectivity removed to separate the receiving part CR from the first semiconductor chip CP1. Thus, the first and second pads PD1 and PD2 are exposed.

Figure 19:
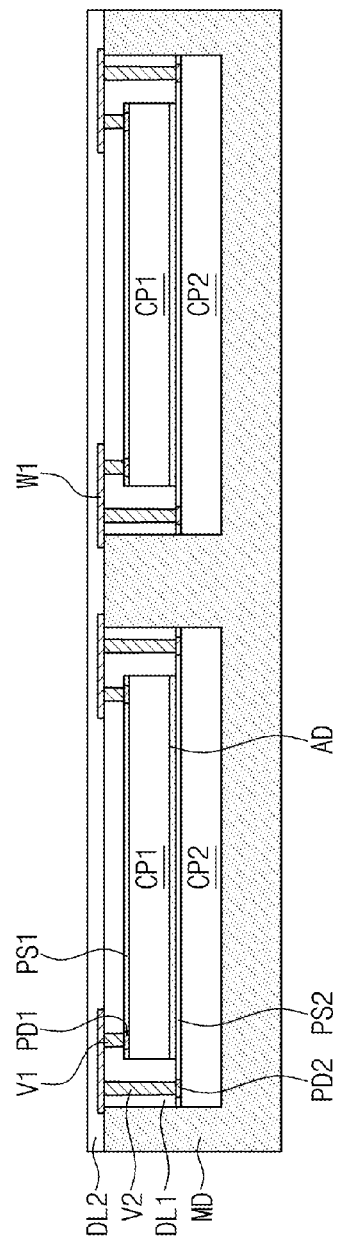

Referring to FIG. 19, in the state that the receiving part CR is separated, the resultant structure of FIG. 18 is overturned. Subsequently, a first insulating layer DL1 is formed on the mold layer MD and then is planarized to expose a top surface of the mold layer MD. Thus, the first insulating layer DL1 fills a space between the first semiconductor chip CP1 and the mold layer MD. The mold layer MD may cover sidewalls of the first insulating layer DL1. Redistribution line vias V1 and V2 are formed to penetrate the first insulating layer DL1. The redistribution line vias V1 and V2 are connected to the pads PD1 and PD2, respectively. Redistribution line patterns W1 are formed on the first insulating layer DL1. A second insulating layer DL2 is formed on the first insulating layer DL1 and the redistribution line patterns W1. The second insulating layer DL2 is formed to also cover the top surface of the mold layer MD.

Figure 20:
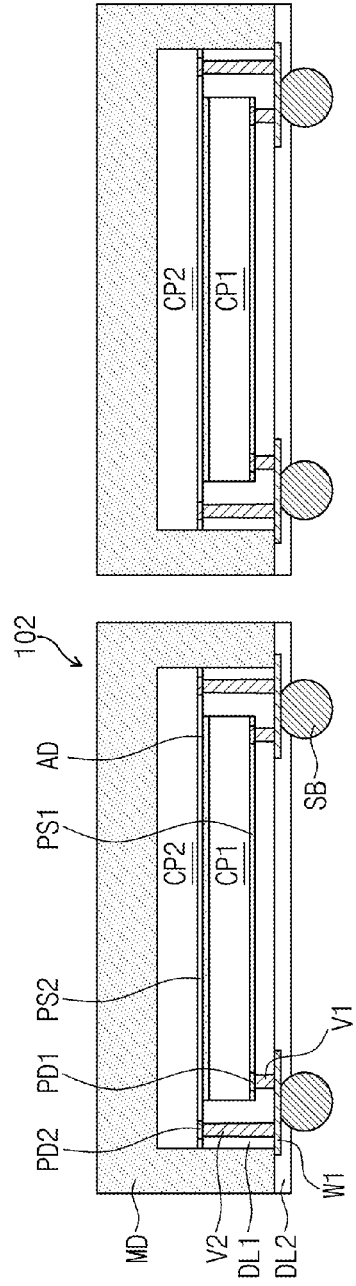

Referring to FIG. 20, portions of the second insulating layer DL2 are removed to partially expose the redistribution line patterns W1 and then solder balls SB are bonded to the exposed redistribution line patterns W1. Subsequently, a singulation process is performed, so that fan-out wafer level packages 102 are separated from each other.

Referring to FIG. 20 again, in the fan-out wafer level package 102 according to the present embodiment, first and second semiconductor chips CP1 and CP2 are stacked and end portions thereof are formed in the stepped-shape. The first and second pads PD1 and PD2 are disposed on the end portions formed in the stepped-shape, respectively. The first and second semiconductor chips CP1 and CP2 may be different kinds of chips. The first and second semiconductor chips CP1 and CP2 are electrically connected to each other by the redistribution line patterns W1. A top surface and sidewalls of the second semiconductor chip CP2 disposed at the uppermost level are covered by the mold layer MD. A width of the mold layer MD is greater than widths of the first and second semiconductor chips CP1 and CP2. A bottom surface and sidewalls of the first semiconductor chip CP1 disposed at the lowermost level are covered by the first insulating layer DL1. The mold layer MD extends to cover the sidewalls of the first insulating layer DL1 and to be in contact with the second insulating layer DL2.

The other methods and the other structures may be the same as or similar to those in the first embodiment.

Fourth Embodiment

Figure 21:
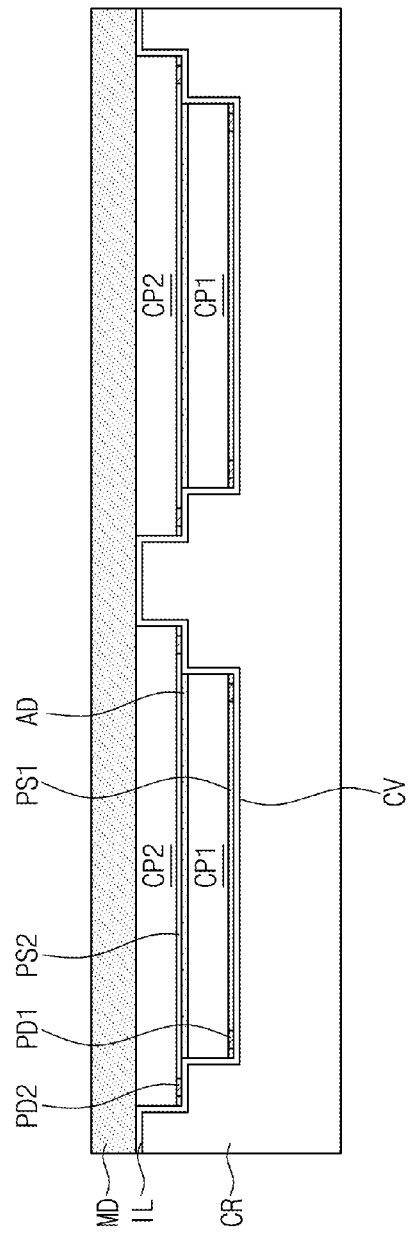
FIGS. 21 to 23 are cross-sectional views illustrating a method of fabricating a fan-out wafer level package according to some example embodiments of the inventive concept.
Figure 22:
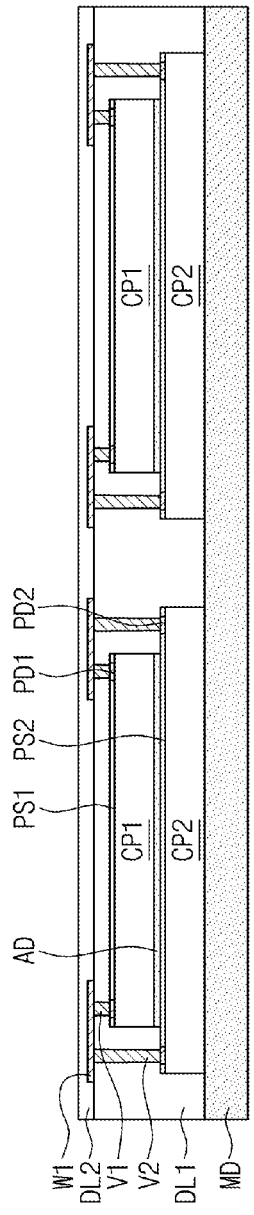
Figure 23:
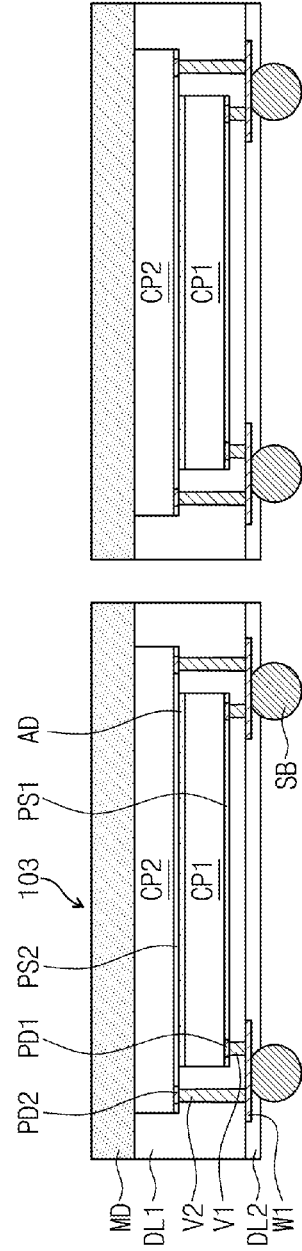

FIGS. 21 to 23 are cross-sectional views illustrating a method of fabricating a fan-out wafer level package according to some example embodiments of the inventive concept.

Referring to FIG. 21, a receiving part CR in which a cavity CV is formed is prepared. The receiving part CR may be a carrier or an assistance mold disposed on the carrier. Each of both inner sidewalls of the cavity CV may have a stepped-shape. An isolation layer IL is conformally formed on the receiving part CR in which the cavity CV is formed. All of a first semiconductor chip CP1 and a second semiconductor chip CP2 are disposed in the cavity CV. First and second pads PD1 and PD2 of the first and second semiconductor chips CP1 and CP2 are disposed to be in contact with the insulation layer IL. An adhesive layer AD is disposed between the first semiconductor chip CP1 and the second semiconductor chip CP2. A mod layer is formed on the receiving part CR. The mold layer MD is formed to cover a top surface of the second semiconductor chip CP2.

Referring to FIG. 22, the isolation layer IL is selectively removed to separate the receiving part CR from the first semiconductor chip CP1. Thus, the first and second pads PD1 and PD2 are exposed. The resultant structure of FIG. 22 from which the receiving part CR is separated is overturned. A first insulating layer DL1 is formed on the mold layer MD. The first insulating layer DL1 is formed to cover a top surface and sidewalls of the first semiconductor chip CP1 and sidewalls of the second semiconductor chip CP2. First and second redistribution line vias V1 and V2 are formed to penetrate the first insulating layer DL1 and to be connected to the first and second pads PD1 and PD2. Redistribution line patterns W1 are formed on the first insulating layer DL1. A second insulating layer DL2 is formed on the first insulating layer DL1 and the redistribution line patterns W1.

Referring to FIG. 23, portions of the second insulating layer DL2 are removed to partially expose the redistribution line patterns W1 and then solder balls SB are bonded to the exposed redistribution line patterns W1. Subsequently, a singulation process is performed, so that fan-out wafer level packages 103 are separated from each other.

Referring to FIG. 23, in the fan-out wafer level package 103 according to the present embodiment, first and second semiconductor chips CP1 and CP2 are stacked and end portions thereof are formed in the stepped-shape. First and second pads PD1 and PD2 are disposed on the end portions formed in the stepped-shape, respectively. The first and second semiconductor chips CP1 and CP2 may be different kinds of chips. A top surface of the second semiconductor chip CP2 disposed at the uppermost level is covered by the mold layer MD. A width of the mold layer MD is greater than widths of the first and second semiconductor chips CP1 and CP2. A bottom surface and sidewalls of the first semiconductor chip CP1 disposed at the lowermost level and sidewalls of the second semiconductor chip CP2 are covered by the first insulating layer DL1.

The other methods and the other structures may be the same as or similar to those in some other example embodiments.

Fifth Embodiment

Figure 24:
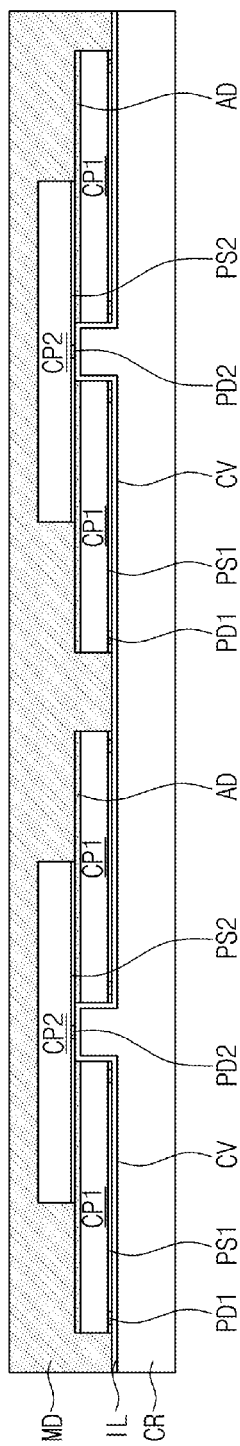
FIGS. 24 and 25 are cross-sectional views illustrating a method of fabricating a fan-out wafer level package according to some example embodiments of the inventive concept.
Figure 25:
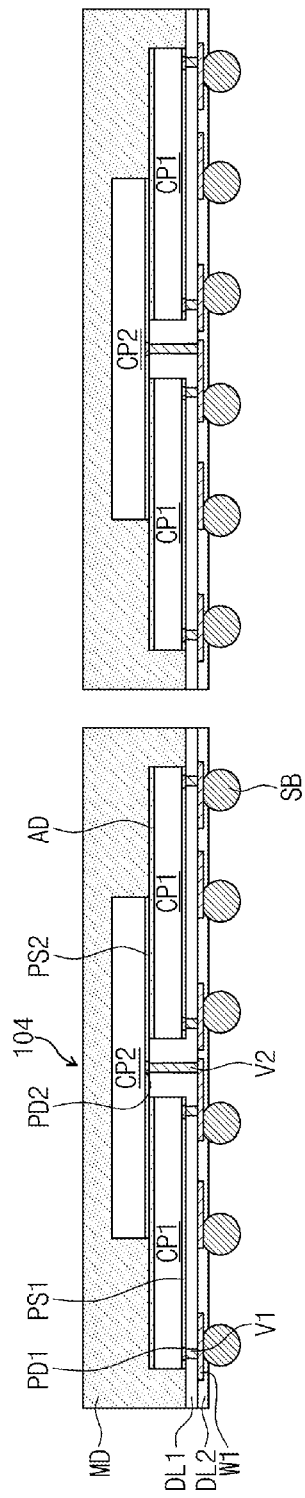

FIGS. 24 and 25 are cross-sectional views illustrating a method of fabricating a fan-out wafer level package according to some example embodiments of the inventive concept.

Referring to FIG. 24, a receiving part CR having cavities CV is prepared. The receiving part CR may be a carrier or an assistance mold disposed on the carrier. An isolation layer IL is conformally formed on the receiving part CR having the cavities CV. Two first semiconductor chips CP1 are disposed in one cavity CV. A width of the cavity CV is greater than two times of a width of the first semiconductor chip CP1. The two first semiconductor chips CP1 are spaced apart from each other in the cavity CV. One first semiconductor chip CP1 is disposed to be adjacent to one inner sidewall of the cavity CV, and another first semiconductor chip CP1 is disposed to be adjacent to another inner sidewall of the cavity CV. An adhesive layer AD is formed on the first semiconductor chips CP1. A second semiconductor chip CP2 is disposed on the first semiconductor chip CP1. The second semiconductor chip CP2 is disposed to cover a pair of the first semiconductor chips CP1 respectively disposed in neighboring cavities CV simultaneously. Each of the first semiconductor chips CP1 includes first pads PD1 respectively disposed on both end portions of each of the first semiconductor chips CP1. The first pad PD1 is in contact with the isolation layer IL. The second semiconductor chip CP2 includes a second pad PD2 disposed at a center portion of the second semiconductor chip CP2. The second pad PD2 is in contact with the isolation layer IL. A mold layer MD is formed to cover the first and second semiconductor chips CP1 and CP2.

Referring to FIG. 25, the isolation layer IL is selectively removed to separate the receiving part CR. And then as described with reference to the first to fourth embodiments, a first insulating layer DL1, redistribution line vias V1 and V2, redistribution line patterns W1, and a second insulating layer DL2 are formed. Solder balls SB are bonded to the redistribution line patterns W1 and then a singulation process is performed, thereby forming fan-out wafer level package 104.

Referring to FIG. 25, in the fan-out wafer level package 104 according to the present embodiment, first and second semiconductor chips CP1 and CP2 are stacked and end portions thereof are formed in a stepped-shape. The second semiconductor chip CP2 covers two first semiconductor chips CP1 neighboring to each other simultaneously. The mold layer MD covers a top surface and sidewalls of the second semiconductor chip CP2 and a portion of a top surface and sidewalls of the first semiconductor chip CP1. A bottom surface of the first semiconductor chip CP1 is covered by the first insulating layer DL1. The first insulating layer DL1 extends fills a space between the two first semiconductor chips CP1 neighboring to each other. The first and second semiconductor chips CP1 and CP2 are electrically connected to each other by the redistribution line patterns W1. The second redistribution line via V2 connected to the second pad PD2 is disposed between the neighboring first semiconductor chips CP1.

The other methods and the other structures may be the same as or similar to those in some other example embodiments.

The semiconductor package techniques described above may be applied to various kinds of semiconductor device and package modules including those.

Figure 26:
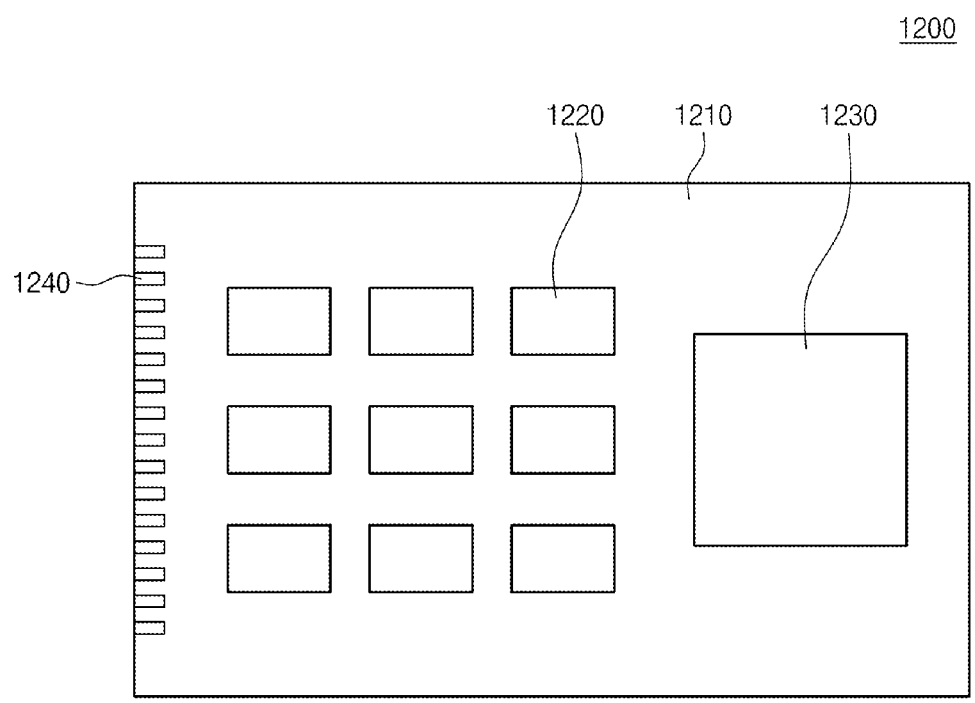
FIG. 26 is a view illustrating an example of package modules including semiconductor packages according to some example embodiments of the inventive concept.

FIG. 26 is a view illustrating an example of package modules including semiconductor packages according to some example embodiments of the inventive concept. Referring to FIG. 26, a package module 1200 may include semiconductor devices 1220 and a semiconductor device 1230 packaged in a quad flat package (QFP) type. Since the semiconductor devices 1220 and 1230 applied with the semiconductor technique according to some example embodiments of the inventive concept are installed on a substrate 1210, the package module 1200 may be formed. The package module 1200 may be connected to an external electronic device through an external connection terminal 1240 disposed at one side of the substrate 1210.

Figure 27:
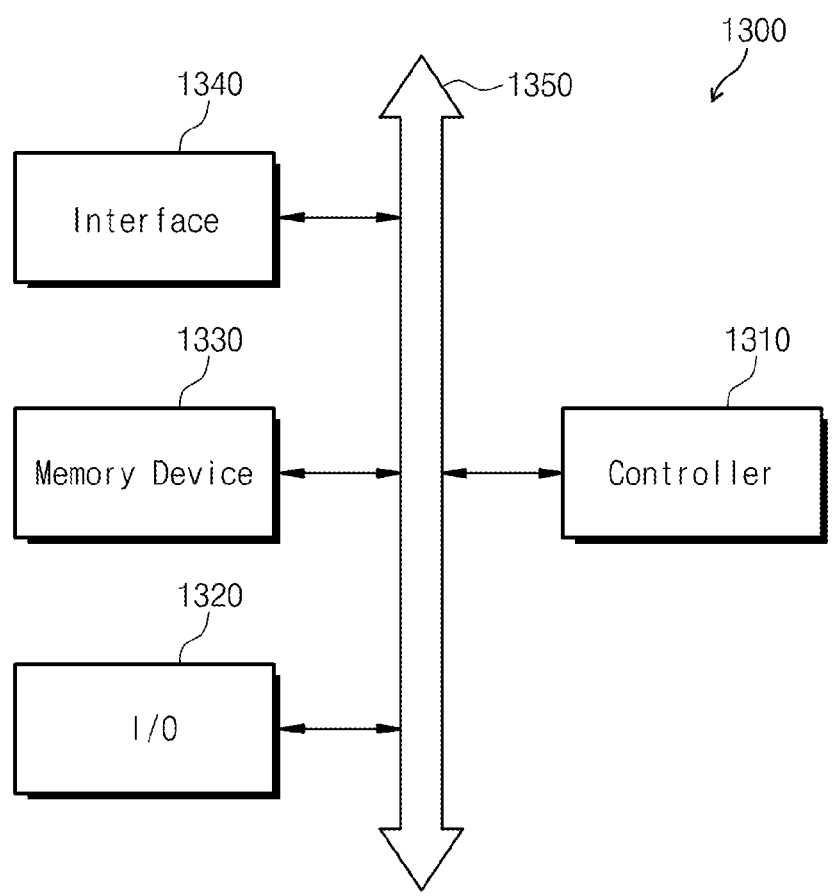
FIG. 27 is a schematic block diagram illustrating an example of electronic systems including semiconductor packages according to some example embodiments of the inventive concept.

The semiconductor package technique described above may applied to an electronic system. FIG. 27 is a schematic block diagram illustrating an example of electronic systems including semiconductor packages according to some example embodiments of the inventive concept. Referring to FIG. 27, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The I/O unit 1320 may include a keypad, a keyboard and/or a display unit. The memory device 1330 may store data and/or commands executed by the controller 1310. The memory device 1330 may include a volatile memory device and/or a non-volatile memory device. Or the memory device 1330 may be formed a flash memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol such as a 3-generational communication system (e.g., code division multiple access (CDMA), global system for mobile communications (GSM), North American digital cellular (NADC), extended time division multiple access (E-TDMA), wideband CDMA (WCDMA), CDMA2000).

Figure 28:
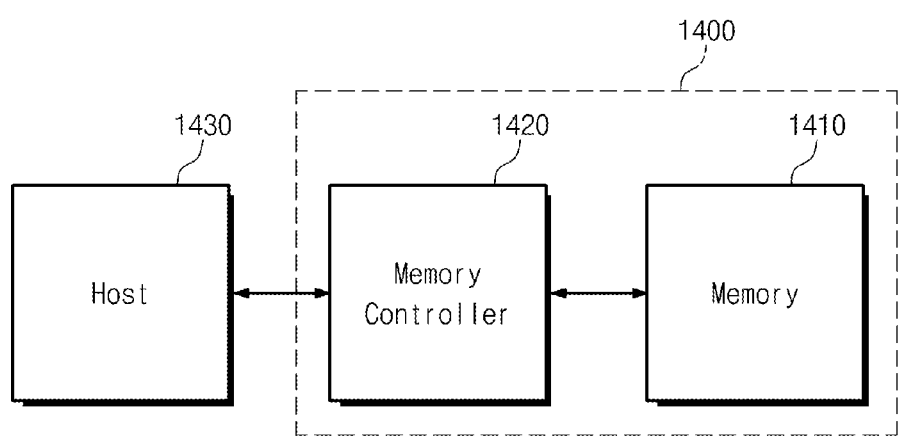
FIG. 28 is a schematic block diagram illustrating an example of memory systems including semiconductor packages according to some example embodiments of the inventive concept.

The semiconductor package technique described above may applied to a memory system. FIG. 28 is a schematic block diagram illustrating an example of memory systems including semiconductor packages according to some example embodiments of the inventive concept. Referring to FIG. 28, a memory system 1400 may include a non-volatile memory device 1410 and a memory controller 1420. The non-volatile memory device 1410 and the memory controller 1420 may store data or read stored data. The non-volatile memory device 1410 may include at least one of non-volatile memory devices applied with the semiconductor package technique according to some example embodiments of the inventive concept. The memory controller 1420 may control the non-volatile memory device 1410 in order to read the stored data and/or to store data in response to read/write request of a host 1430.

According to some example embodiments of the inventive concept, the semiconductor chips may be stacked using the receiving part in which the cavity is formed. Thus, it is possible to prevent the semiconductor chips from falling, such that the fan-out wafer level package of a stack structure may be stably fabricated.

Additionally, since the pads disposed at the end portions of the semiconductor chips are disposed to be in contact with the isolation layer, the mold layer is not in contact with the pads. Thus, the redistribution line via-holes are not formed in the mold layer but are formed in the insulating layer. If the redistribution line via-hole is formed in the mold layer, it may be formed using a laser. In this case, it is difficult to control a detection of an end point and a width thereof, so that it is difficult to exactly form it. However, since the redistribution line via-hole in the insulating layer is formed using the photolithography process and the etching process, it is possible to easily control a detection of an etching end point and the width of the redistribution line via-hole. Additionally, all of the via-holes may be formed simultaneously by the photolithography process and the etching process. Thus, the via-holes according to some example embodiments of the inventive concept may be quickly formed. As a result, according to some example embodiments of the inventive concept, the fan-out wafer level package with improved reliability may be formed more quickly formed.

Furthermore, in the method of fabricating the fan-out wafer level package according to some example embodiments of the inventive concept, since the semiconductor chips are electrically connected to each other by the redistribution line patterns without a wire bonding or a through silicon via (TSV), it is possible to reduce a fabricating cost of the fan-out wafer level package.

The fan-out wafer level package according to some example embodiments of the inventive concept may include various stack structures of the semiconductor chips.

While example embodiments of the inventive concept have been particularly shown and described, it will be understood by those of ordinary skill in the art that various changes in form and details may be made therein without departing from the spirit and scope of the present invention as defined by the following claims.

What is claimed is:

1. A fan-out wafer level package, comprising:
   at least two semiconductor chips sequentially stacked;
   an insulating layer covering a bottom surface and one sidewall of a lowermost semiconductor chip of the at least two semiconductor chips;
   a mold layer covering a top surface of an uppermost semiconductor chip of the at least two semiconductor chips, the mold layer having a width greater than widths of the at least two semiconductor chips;
   a redistribution line pattern in the insulating layer, the redistribution line pattern electrically connected to the at least two semiconductor chips; and
   an external terminal on an opposite side of the insulating layer from the at least two semiconductor chips, the external terminal in contact with the redistribution line pattern.

2. The fan-out wafer level package of claim 1, wherein end portions of the at least two semiconductor chips are formed in a stepped-shape,
   wherein the mold layer extends to cover both sidewalls of the uppermost semiconductor chip, and
   wherein the insulating layer extends to cover both sidewalls of the lowermost semiconductor chip.

3. The fan-out wafer level package of claim 2, wherein the mold layer comprises a protrusion extending to be in contact with one end portion of a semiconductor chip under the uppermost semiconductor chip, and
   wherein the insulating layer extends to be in contact with another end portion of the semiconductor chip under the uppermost semiconductor chip.

4. The fan-out wafer level package of claim 3, wherein the insulating layer extends to cover a sidewall of the protrusion.

5. The fan-out wafer level package of claim 1, wherein the uppermost semiconductor chip has a width greater than a width of the lowermost semiconductor chip, so that the uppermost semiconductor chip covers an entire top surface of the lowermost semiconductor chip,
   wherein the insulating layer extends to cover both sidewalls of the lowermost semiconductor chip, and
   wherein the mold layer extends to cover a sidewall of the insulating layer.

6. The fan-out wafer level package of claim 1, wherein the uppermost semiconductor chip covers at least two lowermost semiconductor chips of the at least two semiconductor chips adjacent to each other simultaneously, and
   wherein the insulating layer fills a space between the at least two lowermost semiconductor chips adjacent to each other.

7. The fan-out wafer level package of claim 6, wherein the mold layer extends to covers sidewalls of the at least two lowermost semiconductor chips adjacent to each other simultaneously.

8. The fan-out wafer level package of claim 1, wherein the insulating layer extends to cover both sidewalls of the uppermost semiconductor chip.

9. A fan-out wafer level package, comprising:
   at least two semiconductor chips;
   an insulating layer covering portions of a first semiconductor chip of the at least two semiconductor chips;
   a mold layer covering portions of a second semiconductor chip of the at least two semiconductor chips;
   a redistribution line pattern in the insulating layer; and
   an external terminal on an opposite side of the insulating layer from the at least two semiconductor chips;
   wherein the first semiconductor chip is stacked relative to the second semiconductor chip,
   wherein the redistribution line pattern is electrically connected to the at least two semiconductor chips, and
   wherein the external terminal is electrically connected to the redistribution line pattern.

10. The fan-out wafer level package of claim 9, wherein the insulating layer covers portions of the second semiconductor chip.

11. The fan-out wafer level package of claim 9, wherein the insulating layer covers portions of the at least two semiconductor chips.

12. The fan-out wafer level package of claim 9, wherein the mold layer covers portions of the first semiconductor chip.

13. The fan-out wafer level package of claim 9, wherein the mold layer covers portions of the at least two semiconductor chips.

14. The fan-out wafer level package of claim 9, wherein the insulating layer covers sidewall portions of the at least two semiconductor chips.

15. The fan-out wafer level package of claim 9, wherein the mold layer covers sidewall portions of the at least two semiconductor chips.

16. A fan-out wafer level package, comprising:
    at least three semiconductor chips;
    an insulating layer covering portions of first semiconductor chips of the at least three semiconductor chips;
    a mold layer covering portions of a second semiconductor chip of the at least three semiconductor chips;
    a redistribution line pattern in the insulating layer; and
    an external terminal on an opposite side of the insulating layer from the at least three semiconductor chips;
    wherein the first semiconductor chips are stacked relative to the second semiconductor chip,
    wherein the redistribution line pattern is electrically connected to the at least three semiconductor chips, and
    wherein the external terminal is electrically connected to the redistribution line pattern.

17. The fan-out wafer level package of claim 16, wherein the insulating layer covers portions of the second semiconductor chip.

18. The fan-out wafer level package of claim 16, wherein the insulating layer covers portions of the at least three semiconductor chips.

19. The fan-out wafer level package of claim 16, wherein the mold layer covers portions of the first semiconductor chips.

20. The fan-out wafer level package of claim 16, wherein the mold layer covers portions of the at least three semiconductor chips.

* * * * *